United States Patent
Chen et al.

(10) Patent No.: US 6,703,178 B2
(45) Date of Patent: Mar. 9, 2004

(54) CHEMICAL AMPLIFIED PHOTORESIST COMPOSITIONS

(75) Inventors: Chi-Sheng Chen, Sanchung (TW); Yen-Cheng Li, Sanchung (TW); Meng-Hsum Cheng, Chung-Li (TW)

(73) Assignee: Everlight USA, Inc., Pineville, NC (US)

( * ) Notice: Subject to any disclaimer, the term of this patent is extended or adjusted under 35 U.S.C. 154(b) by 74 days.

(21) Appl. No.: 10/154,826

(22) Filed: May 28, 2002

(65) Prior Publication Data

US 2003/0232270 A1 Dec. 18, 2003

(51) Int. Cl.[7] .............. G03F 7/004; G03F 7/30
(52) U.S. Cl. ............ 430/170; 430/270.1; 430/326; 430/910
(58) Field of Search ............... 430/270.1, 910, 430/326, 170

(56) References Cited

U.S. PATENT DOCUMENTS

| | | | |
|---|---|---|---|
| 5,837,419 A | * 11/1998 | Ushirogouchi et al. | 430/270.1 |
| 6,271,412 B1 | 8/2001 | Chang et al. | 560/220 |
| 6,280,898 B1 | 8/2001 | Hasegawa et al. | 430/270.1 |
| 6,316,159 B1 | 11/2001 | Chang et al. | 430/270.1 |
| 6,492,091 B2 | * 12/2002 | Kodama et al. | 430/270.1 |
| 6,517,991 B1 | * 2/2003 | Kodama et al. | 430/270.1 |
| 6,579,659 B2 | * 6/2003 | Uetani et al. | 430/270.1 |

* cited by examiner

Primary Examiner—John S. Chu
(74) Attorney, Agent, or Firm—Bacon & Thomas, PLLC

(57) ABSTRACT

The present invention discloses a chemical amplified photoresist composition including a polymer having a repeated unit of the formula (II),

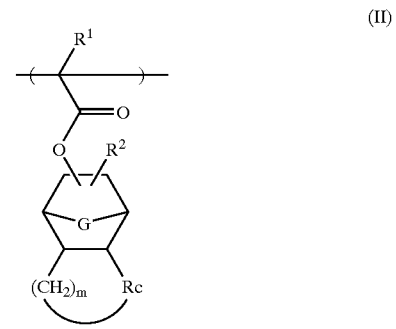

(II)

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3. The chemical amplified photoresist composition of the present invention can be applied to general lithography processes, and particularly to the lithography of ArF, KrF or the like light sources, and exhibit excellent resolution, figures and photosensitivity.

23 Claims, No Drawings

CHEMICAL AMPLIFIED PHOTORESIST COMPOSITIONS

BACKGROUND OF THE INVENTION

1. Field of the Invention

The present invention relates to a photo resist composition, and particularly to a chemical amplified photoresist composition including polymers, and to a method for lithography to which the photoresist composition is applied.

2. Related Prior Art

Integral circuit layering is crucial in semiconductor industries such that the number of integral layers on an integral circuit must be maximized. Therefore, narrower wire widths for lithography are required. To achieve better resolution, light sources with shorter wavelengths or exposure systems with larger numerical apertures are applied.

Recently, a tetrapolymer iBMA-MMA-tBMA-MMA (poly isobornyl methacrylate-methyl methacrylate-t-butyl methacrylate-methacrylic acid) is reported to be a possible resin system for ArF resist:

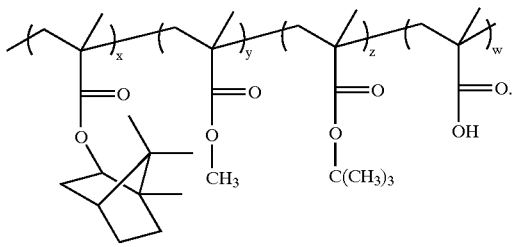

For such polymers, there are still some disadvantages, for example, low etch resistance and bad adhesion due to the four monomer composition. Therefore, a new resin for the compositions of resists is eager to be developed.

U.S. Pat. Nos. 6,271,412 and 6,280,898 and Japanese Patent Publication No. 2001-242627 have disclosed different monomers for synthesizing photosensitive polymers, which can form photoresist compositions and then be applied to semiconductor component manufacturing.

The present invention provides a chemical amplified photoresist composition, which comprises a polymer containing a novel lactone alicyclic unit. And the photoresist comprising the polymer provide well-balanced outcome of etching resistance and substrate adhesion.

SUMMARY OF THE INVENTION

An object of the present invention is to provide a chemical amplified photoresist composition, which is suitable for lithography processes and can exhibit excellent resolution, picture sharpness and photosensitivity.

Another object of the present invention is to provide a method for manufacturing semiconductor devices by lithography process, which is particular suitable for ArF, KrF or the like light source and can exhibit excellent resolution, figures and photosensitivity.

Accordingly, the chemical amplified photoresist composition includes a polymer having repeated units of the formula (II),

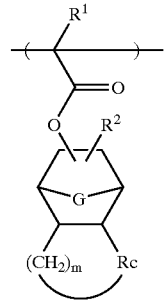

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3.

The chemical amplified photoresist composition can further optionally include a photo-acid generator (PAG), an acid quencher, an additive, a solvent, etc.

The chemical amplified photoresist composition of the present invention can be applied to general lithography processes, and particularly to the process of ArF, KrF or the like light source, whereby excellent resolution, figures and photosensitivity can be achieved. Such processes are well known by those skilled in this art.

The present invention also relates to a method for manufacturing semiconductor devices by lithography, to which the above chemically amplified photoresist composition is applied, and particularly for the exposure process with ArF, KrF or the like light source.

DETAILED DESCRIPTION OF THE INVENTION

The chemical amplified photoresist composition of the present invention includes a polymer having a repeated unit of the formula (II), which is essentially formed through a reaction involving a compound of the following formula (I),

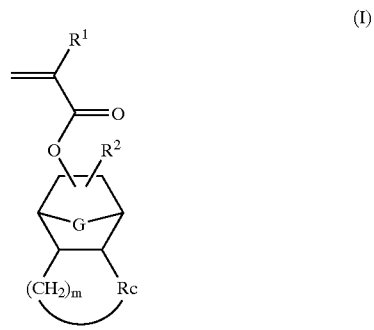

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3.

This reaction can be performed by self-polymerization of the above compound or copolymerizing the above compound with other vinyl monomers in the presence of catalysts.

One of the methods for preparing the formula (I) compound is shown below,

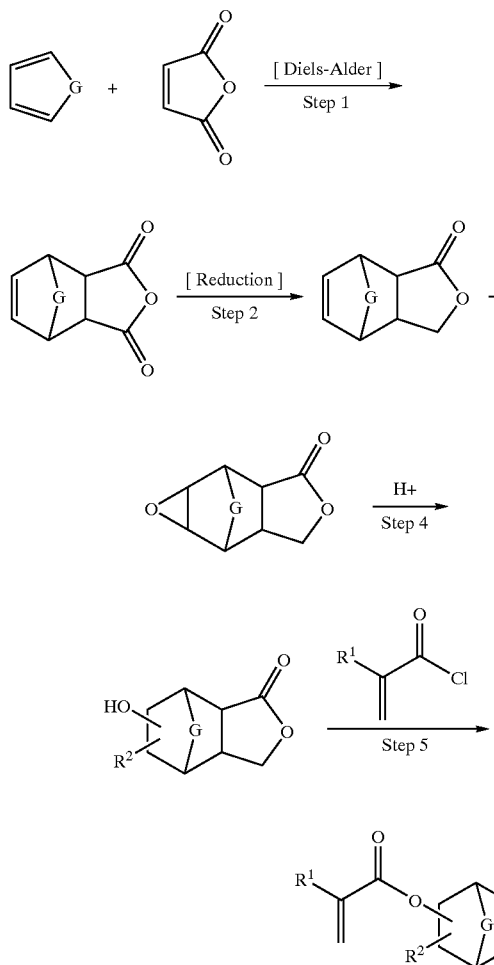

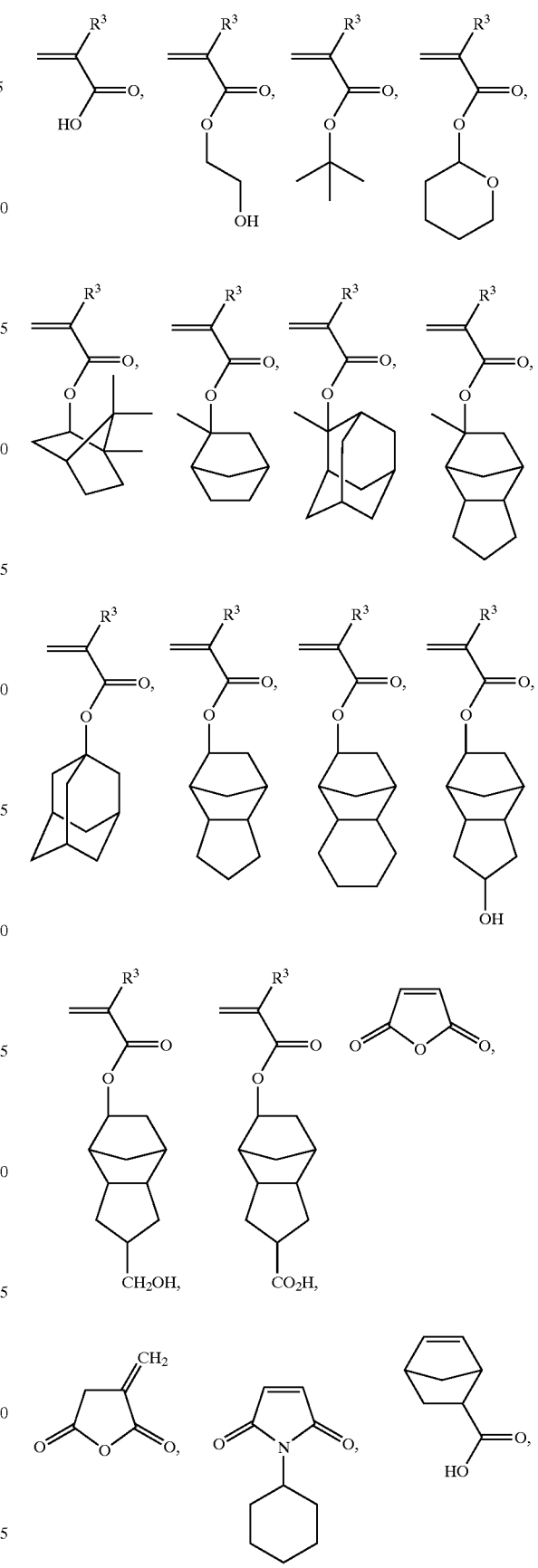

wherein $R^1$, $R^2$ and G are defined as the above.

In Step 1, a proper diene compound such as butadiene, cyclopentadiene, furan and thiophene, reacts with maleic anhydride to perform the Diels-Alder reaction. Then, the acid anhydride adducts are reduced under the well-known conditions in the second Step 2. Preferably reaction is carried out using sodium boron hydride in dried polar solvent such as dimethylformamide or tetrahydrofuran. In Step 3, peroxide is provided to oxidize the double-bond compound into an epoxide. In Step 4, the epoxide reacts with a proper nucleophilic reagent such as water, alcohol and thiol, to perform a ring opening addition reaction under an acidic environment and then obtaining a hydroxyl derivative can be obtained. In Step 5, the hydroxyl derivative reacts with (alkyl)acryloyl chloride or acryloyl chloride to perform esterification resulting in and finally the compound of the formula (I) is obtained. Detailed procedures for preparing the compound of the present invention are described in the preferred embodiments.

The compounds of the formula (I) can be polymerized or copolymerized with other vinyl monomers to produce various polymers with or without the assistance of catalysts. Particularly, when being applied to the 193 nm processes, the vinyl monomers preferably have no aryl group to enable the light to pass therethrough. Below are some examples of vinyl monomers, wherein $R^3$ is H, haloalkyl group, haloalkyl group or $C_1$–$C_4$ alkyl group.

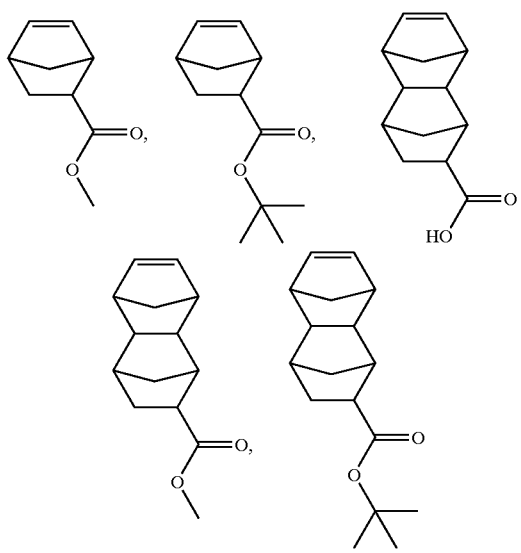

According to the compound of the formula (I), the polymer having a repeated unit of the formula (II) can be synthesized through self-polymerization or copolymerization,

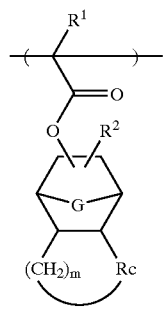
(II)

wherein $R^1$, $R^2$, G, Rc and m are defined as the above.

The structure unit of the polymer or copolymers polymerized or copolymerized from compound (I) can be the following formula (III), formula (IV) or formula (V),

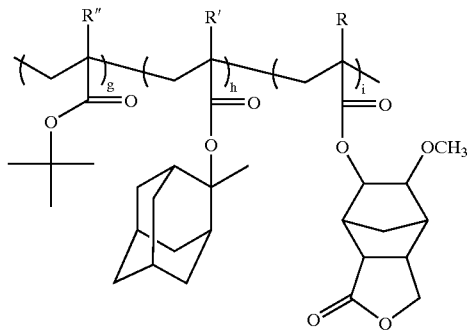
(III)

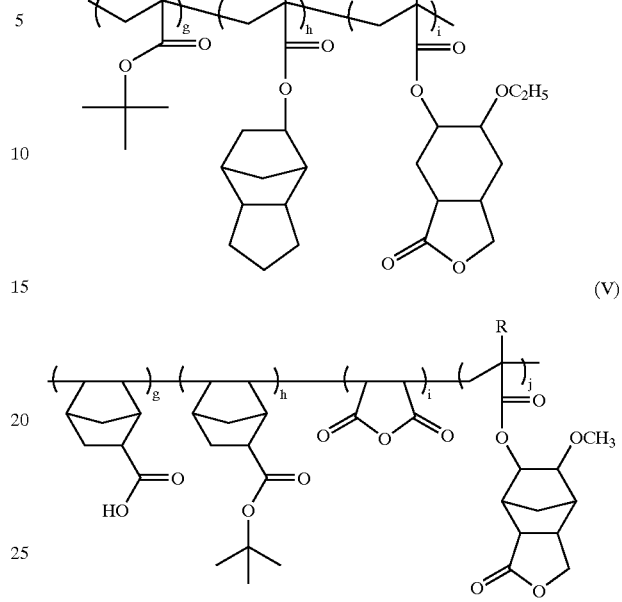

wherein R, R' and R" each independently is H, haloalkyl group or methyl group. In the structure unit of formula (III) and (IV) g+h+i=1, more preferably g/(g+h+i)=0.01–0.8, h/(g+h+i)=0.01–0.8, i/(g+h+i)=0.01–0.8; in the structure unit of formula (V) g+h+i+j=1, more preferably g/(g+h+i+j)=0.01–0.5, h/(g+h+i+j)=0.01–0.8, i/(g+h+i+j)=0.01–0.8, j/(g+h+i+j)=0.01–0.8.

The above polymers can be used individually, or by mixing with one or more thereof.

The polymer of the present invention is preferably soluble in organic solvents, and has a glass transfer temperature (Tg) ranging from 50 to 220° C., molecular weight ranging from 1,000 to 500,000, and degradation temperature (Td) greater than 80° C.

The method of polymerization is not restricted, and is preferably done by mixing the above monomers in the existence of catalysts. The catalysts can be those well known by one skilled in this art, and preferably 2,2'-azo-bis-isobutyronitrile (AIBN) or dimethyl-2,2'-azo-bis-isobutyrate radical initiator (V-601).

The chemical amplified photo resist composition of the present invention can further include a photo-acid generator (PAG), an acid quencher, an additive or a solvent.

The above photo-acid generator is not restricted, but can generate acids under ultraviolet or other radiation sources, and be stable before exposure. The preferred photo-acid generators are as follows:

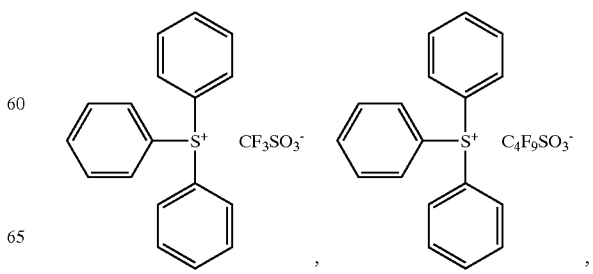

-continued
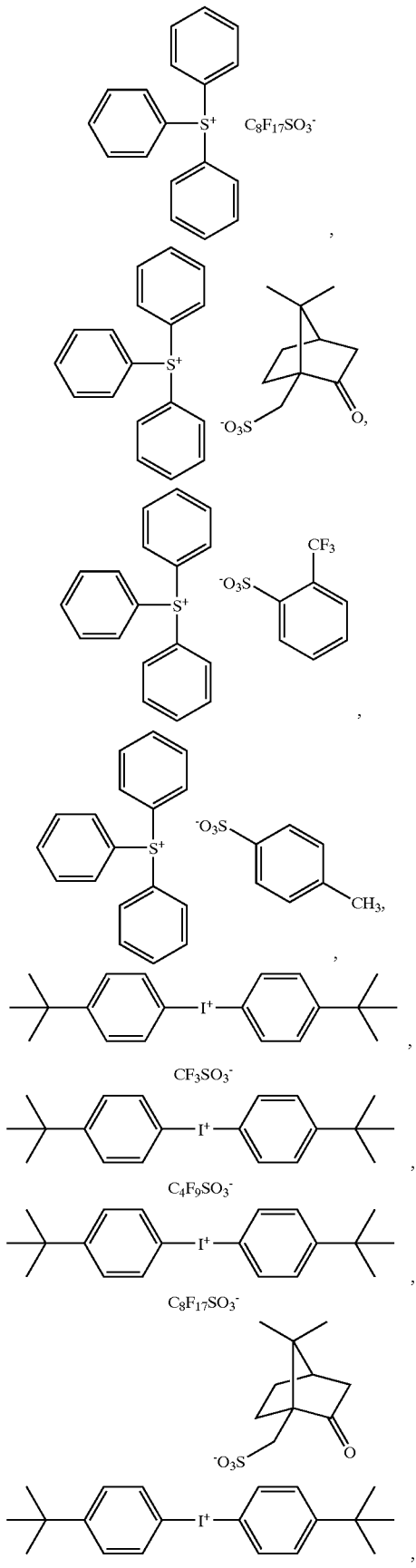
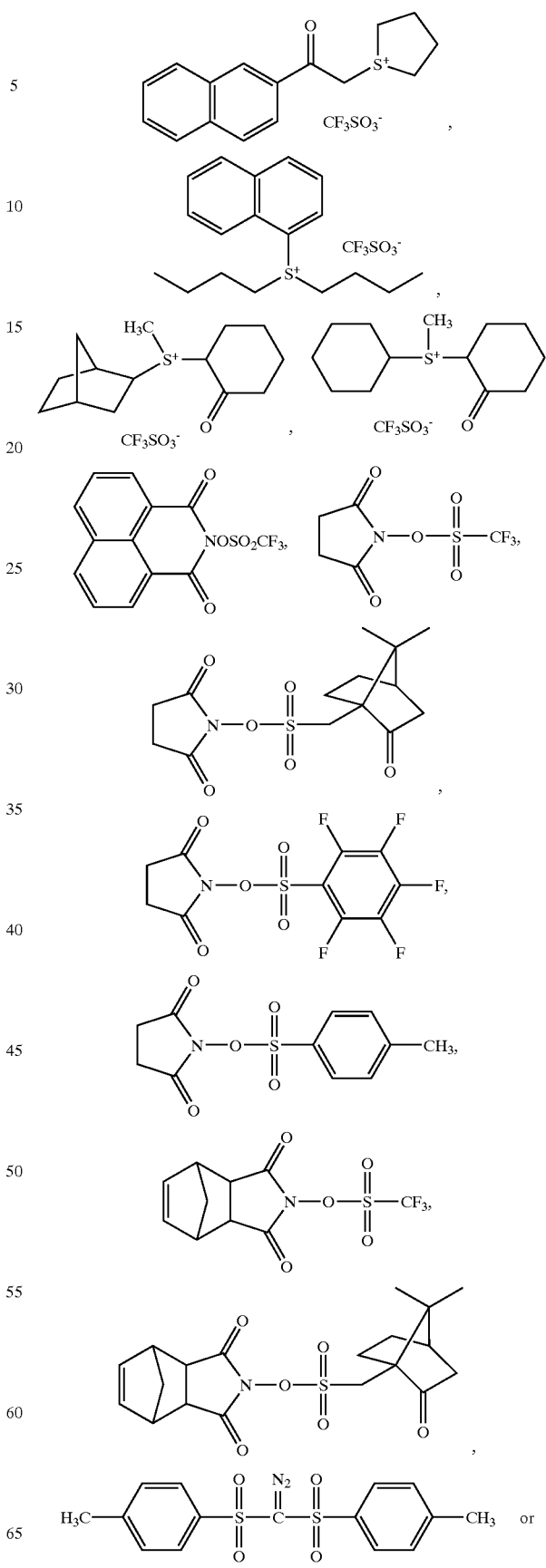

-continued

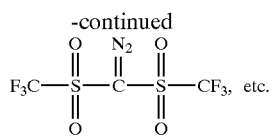

The above photo-acid generators can be used individually, or by mixing with one or more thereof. The photo-acid generator is usually added at 1.0–20 parts per 100 parts of resin in weight, and preferably 0.5–7 parts.

The chemical amplified photoresist composition of the present invention can further include acid quencher to adjust the diffusion of acid. The proper acid quenchers are tetrabutylammonium hydroxide, tetrabutylammonium lactate, tributylamine, trioctylamine, triethanolamine, tris[2-(2-methoxyethoxy)ethyl]amine, N-(2,3-dihydroxypropyl) piperidine, N-(2-hydroxyethyl)piperidine, morpholin, N-(2-hydroxyethyl)morpholin, N-(2-hydroxyethyl)pyrrolidine, N-(2-hydroxyethyl)piperazine, etc. The acid quencher is usually added at 0.001–10 parts per part of the photo-acid generator in weight, and preferably 0.01–1 part.

The additive of the present invention is not restricted, and can be optionally added or not. Proper amounts of sensitizers, dissolution inhibitors, surfactants, stabilizers, dyes or other resins may be a good additive to improve the characteristics of the photpresist composition.

There is no special limit to the solvent of the chemical amplified photoresist compositions of the present invention. Preferably, the solvent suitable for the chemical amplified photoresist compositions of the present invention is higher alcohol (e.g. n-octanol), glycolic acid and its derivatives (e.g. methyl lactate, ethyl lactate and ethyl glycolate), glycolic ether and its derivatives (e.g. glycolic ethyl acetate, glycolic methyl acetate, glycerol methyl acetate), ketoesters (e.g. methyl acetoacetate, ethyl acetoacetate), alkoxy carboxylates (ethyl 2-ethoxyacetate, methyl 3-methoxypropionate, ethyl 3-ethoxypropionate, or methyl ethoxypropionate), ketones (methyl ethyl ketone, methyl pentyl ketone, acetylacetone cyclopentone, cyclohexone, or 2-hepatone) ketoethers (e.g. diacetoalcohol methyl ether), ketoalcohols (e.g. acetoalcohol or diacetone ), alcohol ethers (e.g. glycolic butyl ether or propylene glycol ethyl ether) amides (e.g. dimethylacetamide or dimethyl formamide), ethers (e.g. phenyl ether or triethylene glycol dimethyl ether) or mixture thereof. Preferably, the solvent of the chemical amplified photoresist is n-octyl alcohol, propylene glycol methyl ether acetate, ethyl 3-ethoxypropionate, ethyl 2-ethoxyacetate, methyl 3-methoxypropionate, methylethoxypropionate, methyl ethyl ketone, methylpentylmethyl ketone, cyclopentanone, methyl acetate, ethyl acetate, glycolic butyl ether propylene glycol ethyl ether or mixture thereof.

The solvent is usually added at 200–2,000 parts per 100 parts of resin in weight, and preferably 400–1,000 parts.

The chemical amplified photoresist composition of the present invention can be prepared by first dissolving the polymer in the solvent and then dissolving the other components therein, or by first dissolving the other components which are mixed together previously in the solvent and then dissolving the polymer therein.

Impurities in the chemical amplified photo resist composition, for example, metals and halogens, should be minimized. Therefore, the components can be purified previously, or the produced chemical amplified photoresist composition is purified before using.

In addition to the traditional lithography processes, the chemical amplified photoresist composition of the present invention can be particularly applied to the 193 nm process.

When applying the chemical amplified photoresist composition, lithography general procedures are performed. The photoresist composition is first spread on silicon substrates or other substrates by spinning, spraying, rolling, etc. Usually, the substrate is then baked on a thermoplate to remove the solvent and then exposed with masks to form patterns.

The development solutions for the exposed resist coating can be an alkali solution, for example, ammonia, triethylamine, dimethylaminomethanol, tetramethylammonium hydroxide, sodium hydroxide, potassium hydroxide, sodium carbonate, potassium carbonate, trimethylhydroxylethylamonium hydroxide, etc.

The resolution, shape and sensitivity of the chemical amplified photoresist composition of the present invention are good. Besides, the depth of focus, exposure border and removing border are excellent.

More detailed examples are used to illustrate the present invention, and these examples are used to explain the present invention. The examples below, which are given simply by way of illustration, must not be taken to limit the scope of the invention.

DESCRIPTION OF THE PREFERRED EMBODIMENTS

Preparation Example 1

Synthesis of Monomer (I-1)

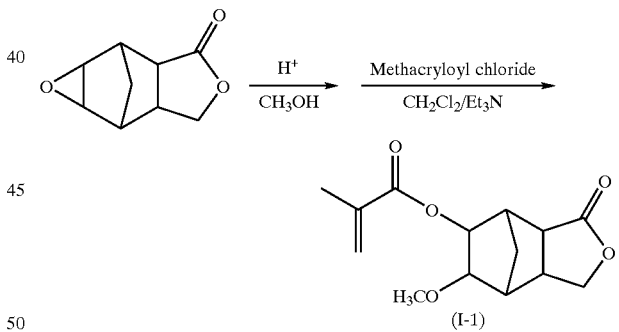

8,9-epoxy-3-oxo-4-oxa-tricyclo[5.2.1.0$^{2,6}$]decane (16.6 g) is dissolved in methanol (200 mL), and then reacts with concentrated sulfuric acid (0.25 mL) to perform resulting in a ring opening reaction. After the reaction is completed, the solution is neutralized and concentrated in vacuum. The residue was dissolved in 200 ml of methylene chloride and 10.2 g of triethylamine. To this mixture below 15° C., 10.5 g of methacryloyl chloride was added dropwise. After the completion of addition, the solution was agitated for 4 hours at room temperature, followed by conventional extraction and washing. The oily substance collected was purified by silica gel column chromatography, yielding 18.4 g of 9-methoxy-5-oxo-4-oxa-tricyclo[5.2.1.0$^{2,6}$]dec-8-yl methacrylate) (I-1) (18.4 g), and the yield is of 69%.

¹H-NMR (CDCl₃, 300 MHz) δ5.89 (1H, brs), 5.37 (1H, brs), 4.81 (1H, m), 3.96 (1H, m), 3.67–3.57 (2H, m), 3.54 (3H, s), 2.79 (1H, m), 2.57 (1H, m), 2.55 (1H, m), 2.37 (1H, m), 1.77–1.74 (4H, m), 1.38 (1H, m).
¹³C-NMR(CDCl₃, 75 MHz) δ171.4, 165.6, 136.0, 124.8, 84.9, 79.5, 70.0, 51.0, 46.1, 45.7, 40.4, 39.1, 32.4. 17.8.

Preparation Example 2

Synthesis of Monomer (I-2)

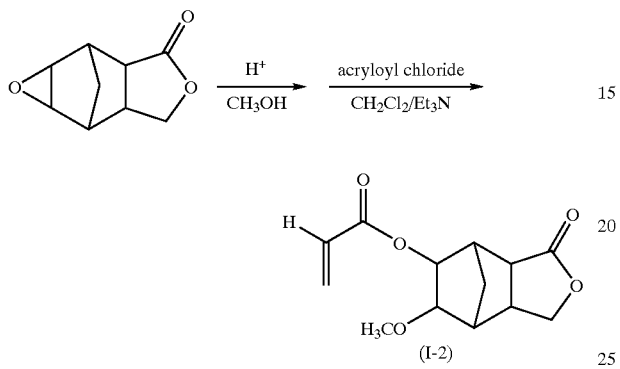

(I-2)

8,9-epoxy-3-oxo-4-oxa-tricyclo[5.2.1.0²,⁶]decane (16.6 g) is dissolved in methanol (200 mL), and then reacts with concentrated sulfuric acid (0.25 mL) resulting to perform in a ring opening reaction. After the reaction is completed, the solution is neutralized and concentrated in vacuum. The residue was dissolved in 200 ml of methylene chloride and 10.2 g of triethylamine. To this mixture below 15° C., 10.5 g of methacryloyl chloride was added dropwise. After the completion of addition, the solution was agitated for 4 hours at room temperature, followed by conventional extraction and washing. The oily substance collected was purified by silica gel column chromatography, yielding 18.4 g of 9-methoxy-5-oxo-4-oxa-tricyclo[5.2.1.0²,⁶]dec-8-yl acrylate) (I-1) (18.9 g), and the yield is of 75%.

¹H-NMR (CDCl₃, 300 MHz, J in Hz) δ6.38 (1H, dd, J=17.4, 0.6), 6.11 (1H, dd, J=17.4, 10.5), 5.82 (1H, dd, J=10.5, 0.56), 5.01 (1H, brs), 4.17 (1H, d, J=5.0), 3.86 (1H, d, J=5.6), 3.79 (1H, dd, J=5.6, 2.7), 3.72 (3H, s), 2.95 (1H, m), 2.81 (1H, m), 2.73 (1H, m), 2.56 (1H, brs), 1.95 (1H, d, J=10.9), 1.57 (1H, d, J=10.9).
¹³C-NMR(CDCl₃, 75 MHz) δ171.9, 165.0, 130.7, 128.6, 85.4, 80.0, 70.5, 51.6, 46.7, 46.2, 40.8, 39.6, 32.9.

Preparation Example 3

Synthesis of Monomers (I-3)

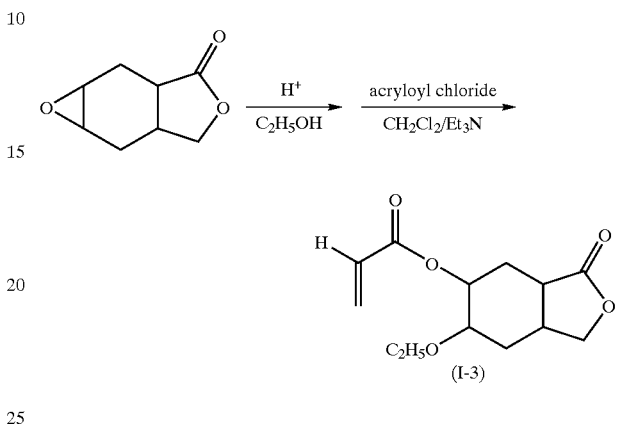

(I-3)

Repeat steps of Example 2, but replace the initial reactant 8,9-epoxy-3-oxo-4-oxa-tricyclo[5.2.1.0²,⁶]decane is with 3,4-epoxy-7-oxo-8-oxa-bicyclo[4.3.0]nonane, and replace methanol with anhydrous ethanol. The colorless oil product, 4-ethoxy-9-oxo-8-oxa-bicyclo[4.3.0]non-3-yl acrylate (I-3), is then obtained.

¹H-NMR (CDCl₃, 300 MHz, J in Hz) δ6.28 (1H, dd, J=17.4, 1.8), 5.99 (1H, dd, J=17.4, 10.6), 5.75 (1H, dd, J=10.6, 1.8), 4.91 (1H, brs), 4.11 (1H, m), 3.85 (1H, m), 3.58 (1H, m), 3.44 (1H, m), 3.22 (1H, m), 2.61–2.47 (2H, m), 2.25 (1H, m), 1.91–1.72 (2H, m), 1.09–0.97 (5H, m).
¹³C-NMR(CDCl₃, 75 MHz) δ171.6, 164.7, 130.9, 128.0, 71.2, 70.8, 69.2, 63.8, 35.7, 30.3, 25.1, 20.7, 14.9.

Preparation Examples 4–7

Repeat steps of Preparation Example 1, but replace the initial reactants and solvents with those listed in Table A, in which the products are listed.

TABLE A

| | Initial Reactant | Solvent | Product |
|---|---|---|---|
| Preparation Example 4 | (structure) | 2-Propanol | (structure) I-4 |

TABLE A-continued

| | Initial Reactant | Solvent | Product |
|---|---|---|---|
| Preparation Example 5 | | Cyclohexanethiol | I-5 |
| Preparation Example 6 | | $H_2O$, THF | I-6 |
| Preparation Example 7 | | Methanol | I-7 |

Preparation Example 8

Synthesis of the Polymer of the Formula (II-1)

Tetrahydrofuran (20 mL), tert-butyl methacrylate (2.13 g), 2-methyl-2-adamantyl methacrylate (4.69 g) and 9-methoxy-5-oxo-4-oxa-tricyclo[5.2.1.0$^{2,6}$]dec-8-yl methacrylate (3.99 g) are mixed in a reactor, and then an initiator 2,2'-azo-bis-isobutyronitrile (AIBN) (1.1 g) is added therein to perform reaction at 65° C. After the reaction is completed, the solution to which tetrahydrofuran (20 mL) is added is transferred into a container containing hexane (1L) to generate white precipitate. The precipitate is then dried by filtration to obtain white powders (8.43 g), i.e., the polymer of the formula (II-1) with repeated units. The yield is 78%. Weight-average molecular weight of the polymer measured with GPC is 14,100, and glass transition temperature (Tg) is 169° C.

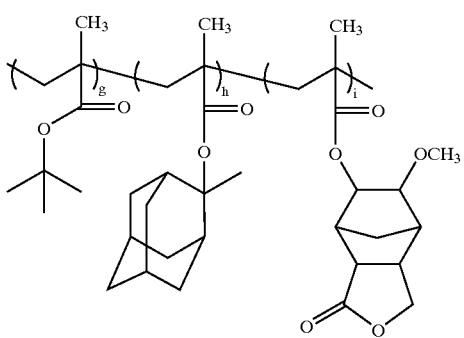

formula (II-1)

[g = 0.30, h = 0.40, i = 0.30, $M_w$ = 14100]

Preparation Example 9

Synthesis of the Polymer of the formula (II-2)

Tetrahydrofuran (20 mL), tert-butyl methacrylate (2.13 g), 2-methyl-2-adamantyl methacrylate (4.69 g) and 4-ethoxy-9-oxo-8-oxa-bicyclo[4.3.0]non-3-yl methacrylate (4.02 g) are mixed in a reactor. Next, an initiator 2,2'-azo-bis-isobutyronitrile (AIBN) (1.1 g) is added to perform reaction at 70° C. overnight, and then tetrahydrofuran (20 mL) is added therein. Next, the solution is transferred into a container containing hexane (1 L) to generate white precipitate. The precipitate is then dried by filtration to obtain white powders (6.83 g), i.e., the polymer of the formula (II-2) with repeated units. The yield is 63%. weight-average molecular weight of the polymer measured with GPC is 19,200, and glass transition temperature (Tg) is 121° C.

formula (II-2)

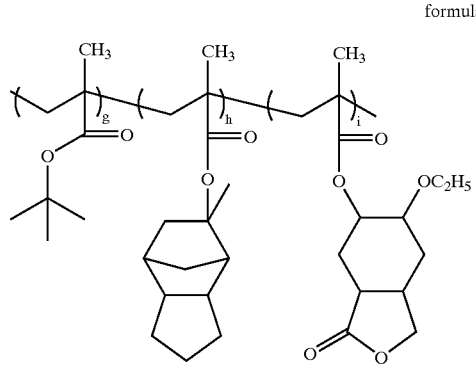

[g = 0.30, h = 0.40, i = 0.30, $M_w$ = 19200]

Preparation Examples 10–34

Repeat procedures of Preparation Example 1, but different monomers are used for polymerization and white polymer powders, having the following formulae (II-3)–(II-27), can be obtained.

formula (II-3)

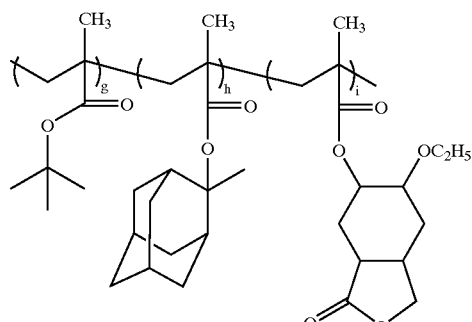

[g = 0.30, h = 0.40, i = 0.30, $M_w$ = 16200]

formula (II-4)

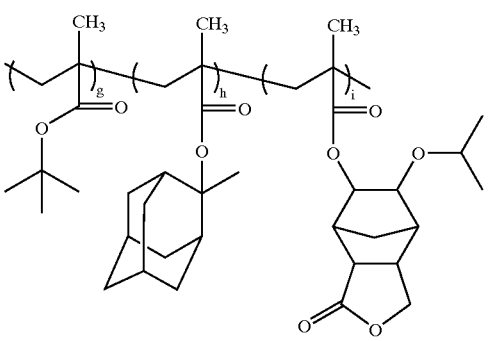

[g = 0.30, h = 0.40, i = 0.30, $M_w$ = 18700]

formula (II-5)

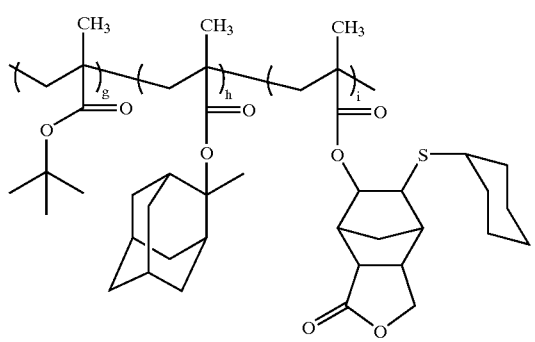

[g = 0.30, h = 0.40, i = 0.30, $M_w$ = 17300]

formula (II-6)

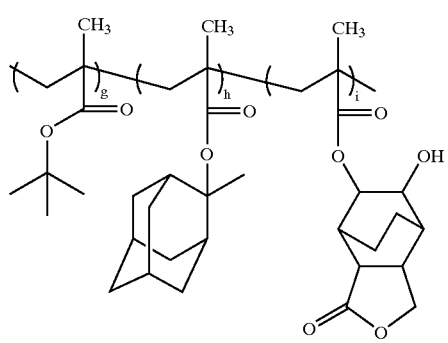

[g = 0.30, h = 0.40, i = 0.30, = 15400]

formula (II-7)

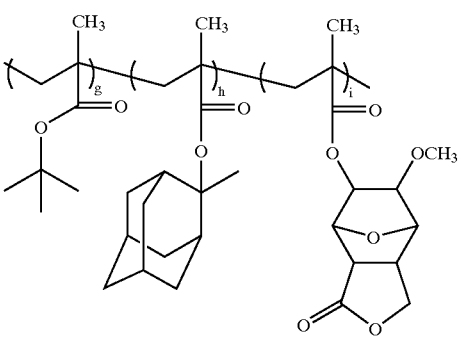

[g = 0.30, h = 0.40, i = 0.30, $M_w$ = 14600]

formula (II-8)
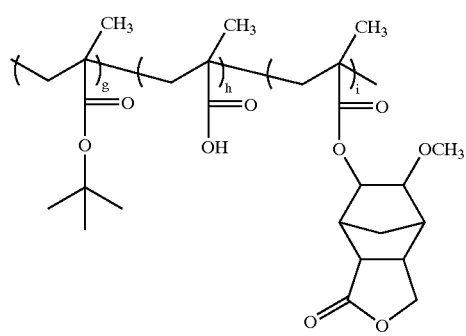
[g = 0.50, h = 0.10, i = 0.40, $M_w$ = 10200]
formula (II-9)
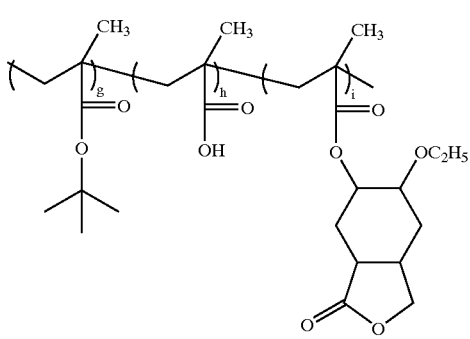
[g = 0.50, h = 0.10, i = 0.40, $M_w$ = 9700]
formula (II-10)
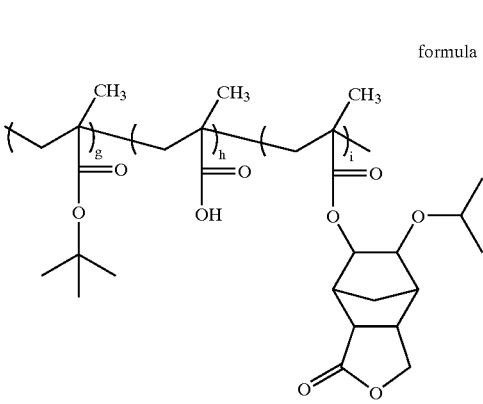
[g = 0.50, h = 0.10, i = 0.40, $M_w$ = 11600]
formula (II-11)
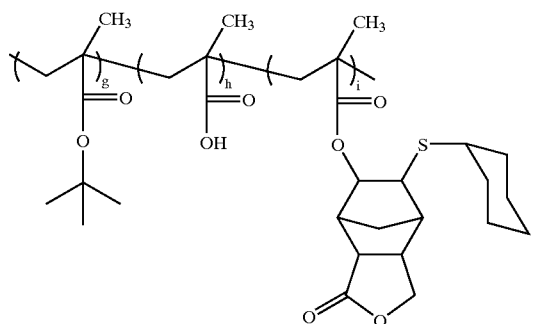
[g = 0.50, h = 0.10, i = 0.40 $M_w$ = 11500]
formula (II-12)
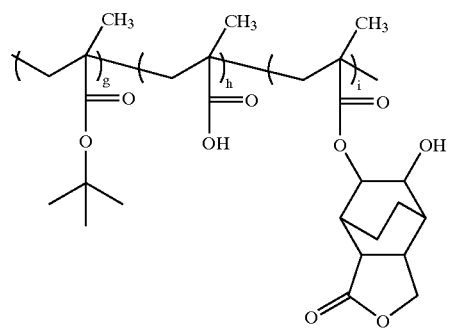
[g = 0.50, h = 0.10, i = 0.40, $M_w$ = 9300]
formula (II-13)
[g = 0.50, h = 0.10, i = 0.40, $M_w$ = 8700]
formula (II-14)
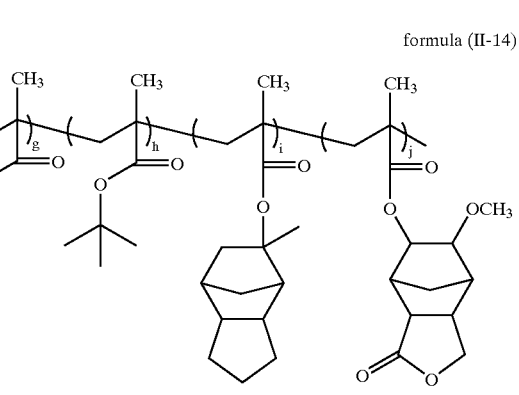
[g = 0.05, h = 0.30, i = 0.40, j = 0.25, $M_w$ = 10500]
formula (II-15)
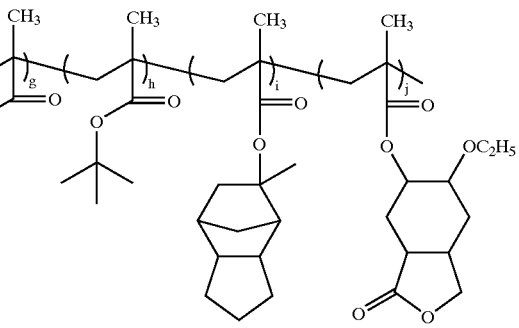
[g = 0.05, h = 0.30, i = 0.40, j = 0.25, $M_w$ = 13300]

formula (II-16)
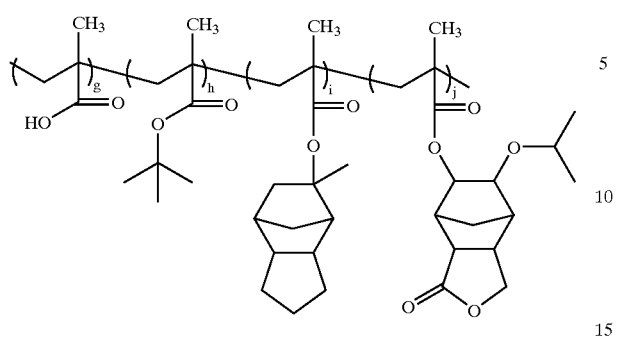
[g = 0.05, h = 0.30, i = 0.40, j = 0.25, $M_w$ = 12600]
formula (II-17)
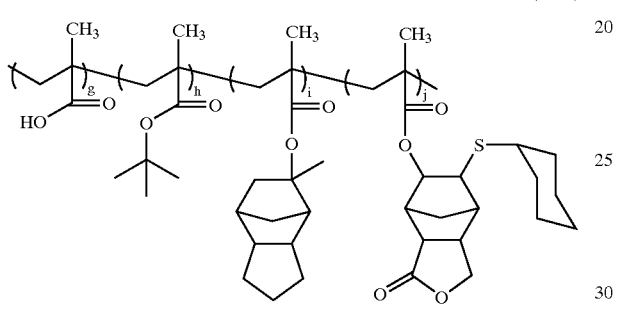
[g = 0.05, h = 0.30, i = 0.40, j = 0.25, $M_w$ = 9500]
formula (II-18)
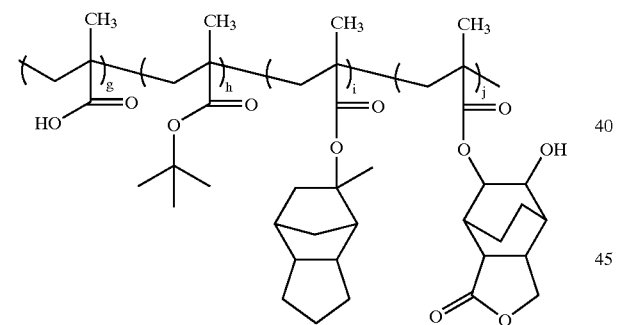
[g = 0.05, h = 0.30, i = 0.40, j = 0.25, $M_w$ = 11100]
formula (II-19)
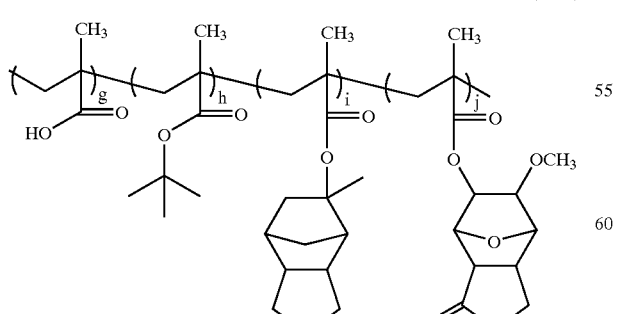
[g = 0.05, h = 0.30, i = 0.40, j = 0.25, $M_w$ = 11700]
formula (II-20)
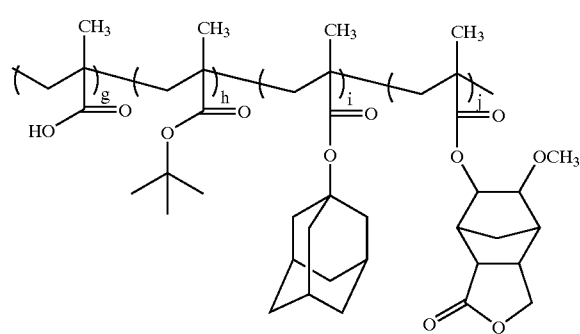
[g = 0.05, h = 0.40, i = 0.30, j = 0.25, $M_w$ = 10800]
formula (II-21)
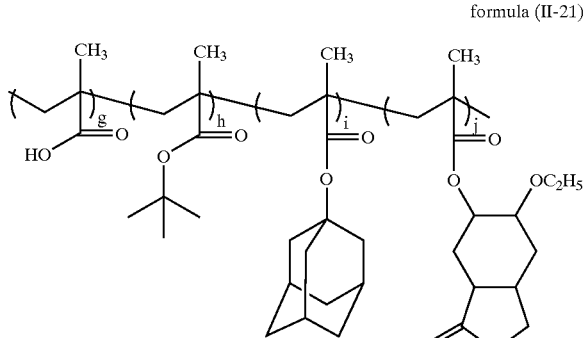
g = 0.05, h = 0.40, i = 0.30, j = 0.25, $M_w$ = 9600]
formula (II-22)
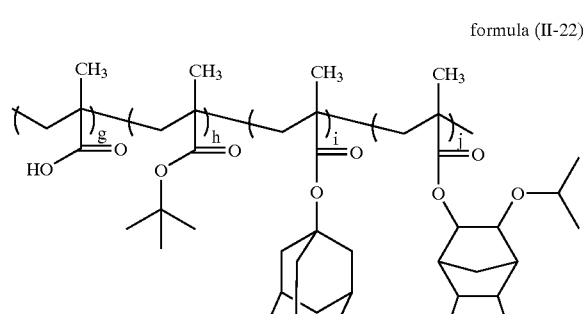
[g = 0.05, h = 0.40, i = 0.30, j = 0.25, $M_w$ = 9900]
formula (II-23)
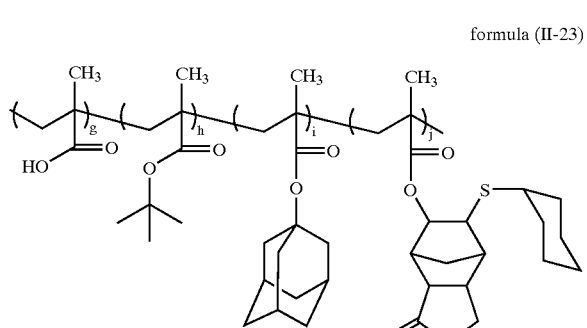
[g = 0.05, h = 0.40, i = 0.30, j = 0.25, $M_w$ = 10500]

-continued formula (II-24)

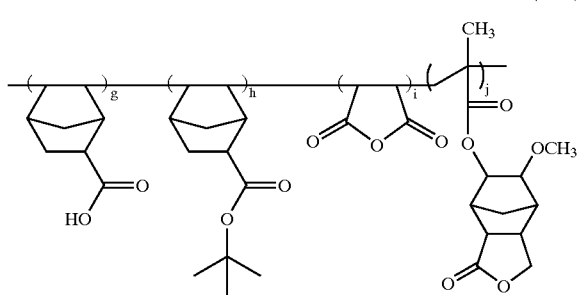

[g = 0.05, h = 0.40, i = 0.45, j = 0.10, $M_w$ = 13900]

formula (II-25)

[g = 0.05, h = 0.40, i = 0.45, j = 0.10, $M_w$ = 12600]

formula (II-26)

[g = 0.05, h = 0.40, i = 0.45, j = 0.10, $M_w$ = 13400]

formula (II-27)

[g = 0.05, h = 0.40, i = 0.45, j = 0.10, $M_w$ = 11700]

EXAMPLE 1

Preparing the Photoresist Composition

The polymer of the formula (II-1) (2 g) obtained from Preparation Example 8, triphenylsulfonium perfluoro-1-butanesulfonate (TPS-PFBS) (0.05 g), tert-butyl cholate (TBC) (0.06 g), propylene glycol monomethyl ether acetate (PGMEA) (10.4 g) and N-(hydroxy methyl)piperidine (0.5 mg) are mixed well and then filtered through a 0.451 μm filter. The filtrate is then spread on a piece of dry silicon by spinning to form a thin film.

The thin film is then dried at 130° C. for 90 seconds to obtain a 317.6 nm thick film. Next, the film is exposed under a DUV light source with 193 nm wavelength and 10–35 mj/cm², and then baked on a thermoplate at 130° C. for 90 seconds.

Next, the film is developed with tetramethyl ammonium hydroxide (TMAH) aqueous solution (2.38%), and then washed with deionized water, and spin-dried. The exposed area shows a structure of resolution of 0.1 5 μm under the observation of scanning electronic microscopy (SEM).

EXAMPLES 2–16

Preparing the Photoresist Compositions

Repeat procedures of Example a, but the polymer is replaced with those obtained from Preparation Examples 9–15, 21–27 and 31. Table B shows the results.

TABLE B

| Example | Polymer | Thickness of the Film (nm) | Resolution (μm) |
|---|---|---|---|
| Example 2 | (II-2) | 317.8 | 0.18 |
| Example 3 | (II-3) | 326.0 | 0.18 |
| Example 4 | (II-4) | 298.5 | 0.15 |
| Example 5 | (II-5) | 278.8 | 0.15 |
| Example 6 | (II-6) | 321.0 | 0.15 |
| Example 7 | (II-7) | 306.8 | 0.18 |
| Example 8 | (II-8) | 304.5 | 0.15 |
| Example 9 | (II-14) | 320.7 | 0.20 |
| Example 10 | (II-15) | 334.9 | 0.20 |
| Example 11 | (II-16) | 310.2 | 0.15 |
| Example 12 | (II-17) | 296.6 | 0.15 |
| Example 13 | (II-18) | 275.8 | 0.15 |
| Example 14 | (II-19) | 330.5 | 0.18 |
| Example 15 | (II-20) | 309.7 | 0.15 |
| Example 16 | (II-24) | 318.5 | 0.20 |

Accordingly, these chemical amplified photoresist compositions of the present invention can be successfully applied to general lithography processes, and particularly to the ArF, KrF or the like process to obtain superior resolution, picture sharpness and photosensitivity.

From the foregoing description, one skilled in the art can easily ascertain the essential characteristics of this invention, and without departing from the scope thereof, can make various changes and modifications of the invention to adapt it to various usages and conditions. Thus, other embodiments are also within the claims.

What is claimed is:

1. A chemical amplified photoresist composition, comprising a polymer having a repeated unit of the formula (II), (II)

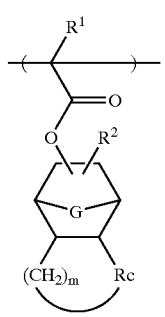

wherein $R^1$ is H, haloalkyl group or $C_1$–$C_4$ alkyl group; $R^2$ is hydroxyl group, $C_1$–$C_8$ alkoxy group or $C_1$–$C_8$ thioalkyl group; G is $(CH_2)_n$, O or S, wherein n is 0, 1, 2, 3 or 4; Rc is a lactone group; and m is 1, 2 or 3.

2. The composition of claim 1, wherein said $R^1$ is H or methyl group.

3. The composition of claim 1, wherein said $R^2$ is hydroxyl group, $C_1$–$C_4$ alkoxy group, or thioalkyl group.

4. The composition of claim 1, wherein said m is 1.

5. The composition of claim 1, wherein said G is $(CH_2)_n$, n is 0, 1 or 2.

6. The composition of claim 1, wherein said G is O or S.

7. The composition of claim 1, wherein said polymer has the following formula (II-1), (II-2), (II-3), (II-4), (II-5), (II-6), or (II-7):

formula (II-1)
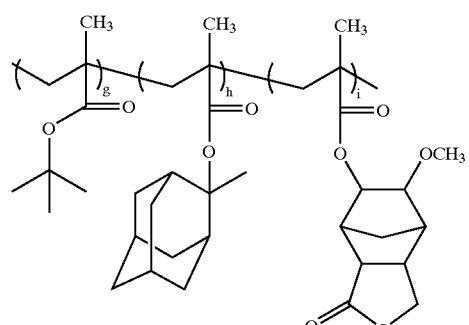

formula (II-2)
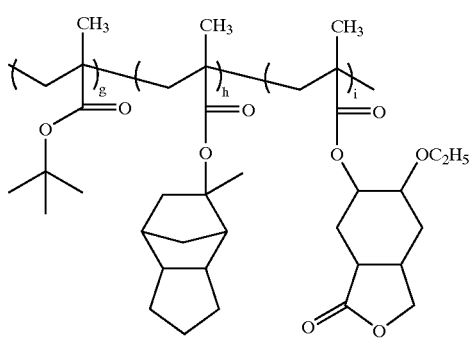

formula (II-3)
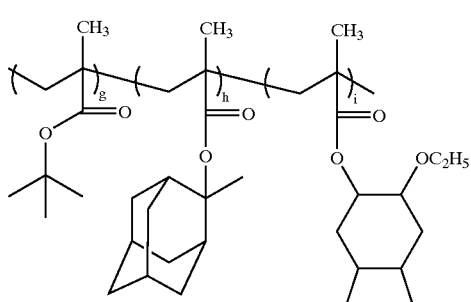

formula (II-4)
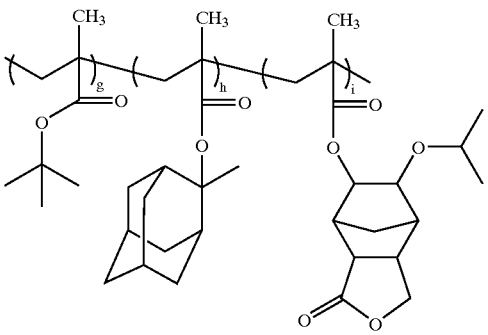

formula (II-5)
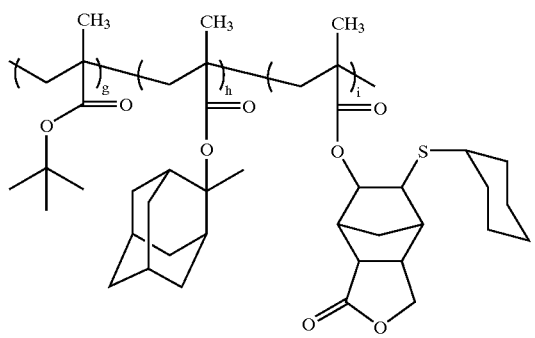

formula (II-6)
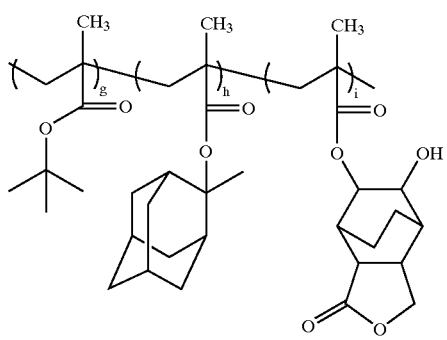

formula (II-7)
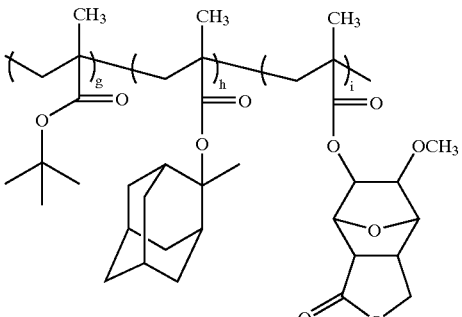

wherein g+h+i=1.

8. The composition of claim 7, wherein g/(g+h+i) ranges from 0.01 to 0.8, h/(g+h+i) ranges from 0.01 to 0.8, and i/(g+h+i) ranges from 0.01 to 0.8.

9. The composition of claim 1, wherein said polymer has the following formula (II-8), (II-9), (II-10), (II-11), (II-12), or (II-13):

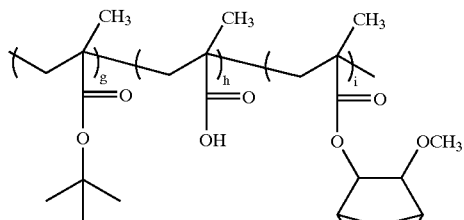
formula (II-8)

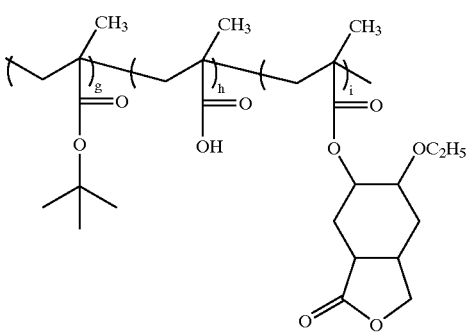
formula (II-9)

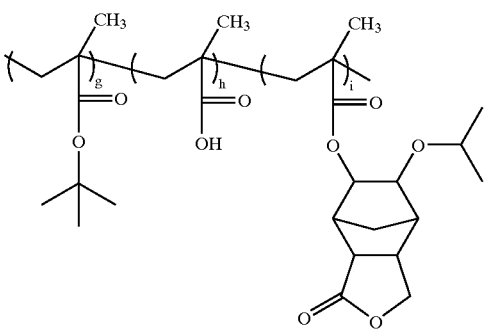
formula (II-10)

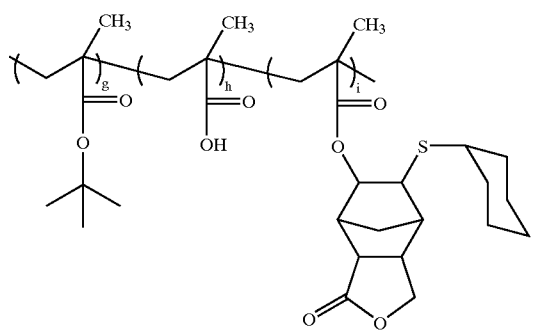
formula (II-11)

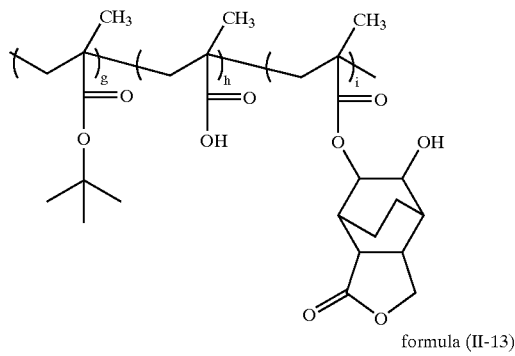
formula (II-12)

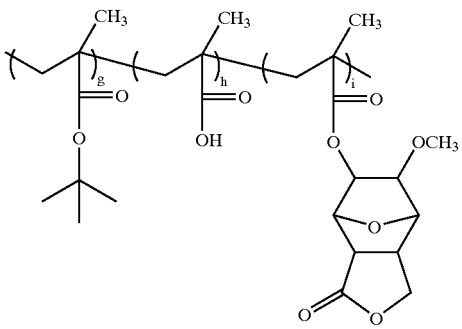
formula (II-13)

wherein g+h+i=1.

10. The composition of claim 7, wherein g/(g+h+i) ranges from 0.01 to 0.8, h/(g+h+i) ranges from 0.01 to 0.5, and i/(g+h+i) ranges from 0.01 to 0.8.

11. The composition of claim 1, wherein said polymer has the following formula (II-14), (II-15), (II-16), (II-17), (II-18), or (II-19):

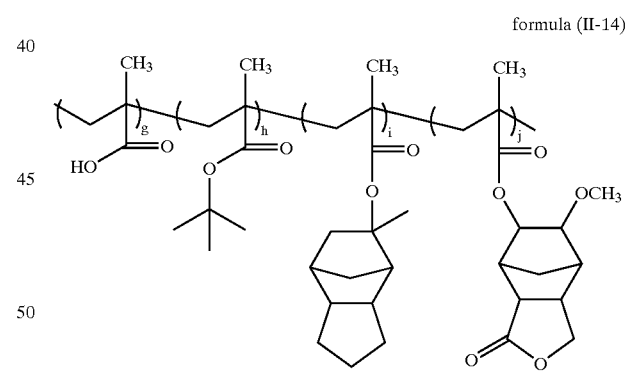
formula (II-14)

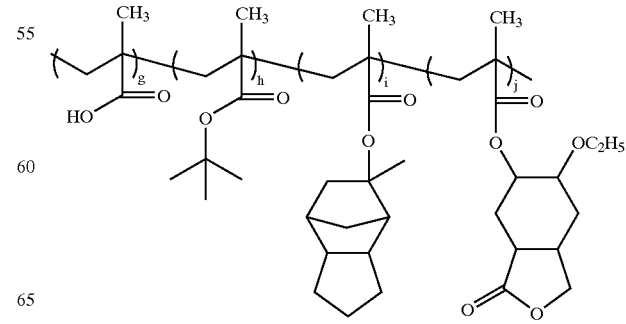
formula (II-15)

formula (II-16)

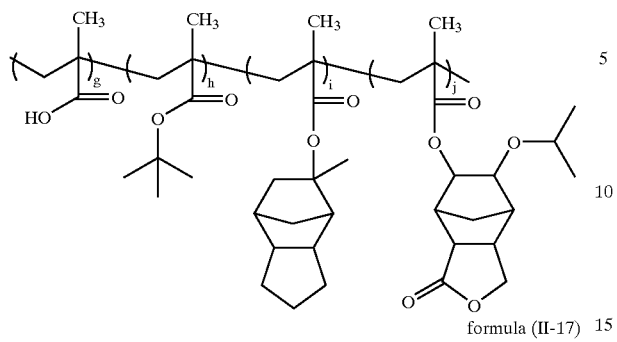

formula (II-17)

formula (II-18)

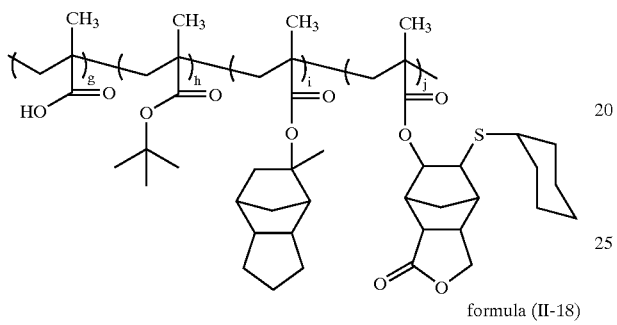

formula (II-19)

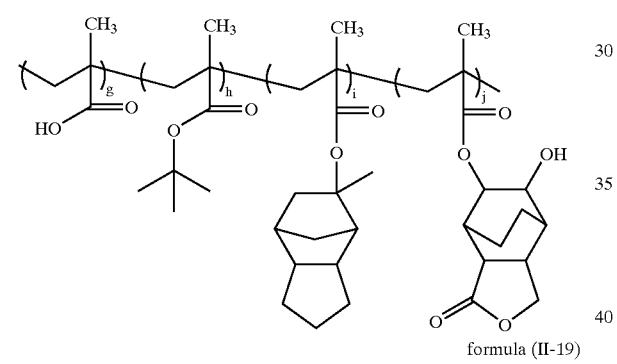

formula (II-20)

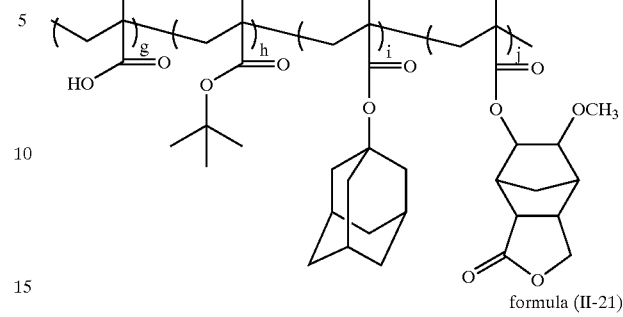

formula (II-21)

formula (II-22)

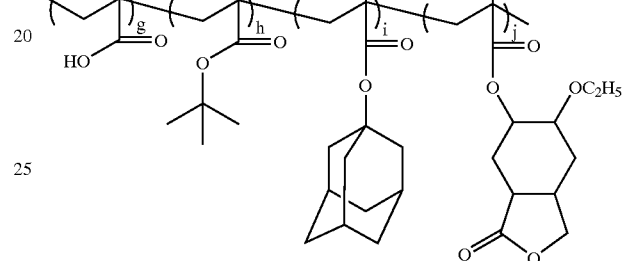

formula (II-23)

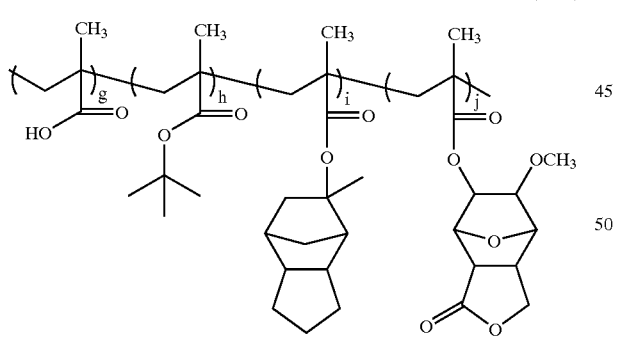

wherein g+h+i+j=1.

12. The composition of claim 7, wherein g/(g+h+i+j) ranges from 0.01 to 0.5, h/(g+h+i+j) ranges from 0.01 to 0.8, i/(g+h+i+j) ranges from 0.01 to 0.8, and j/(g+h+i+j) ranges from 0.01 to 0.8.

13. The composition of claim 1, wherein said polymer has the following formula (II-20), (II-21), (II-22), or (II-23):

wherein g+h+i+j=1.

14. The composition of claim 7, wherein g/(g+h+i+j) ranges from 0.01 to 0.5, h/(g+h+i+j) ranges from 0.01 to 0.8, i/(g+h+i+j) ranges from 0.01 to 0.8, and j/(g+h+i+j) ranges from 0.01 to 0.8.

15. The composition of claim 1, wherein said polymer has the following formula (II-24), (II-25), (II-26), or (II-27):

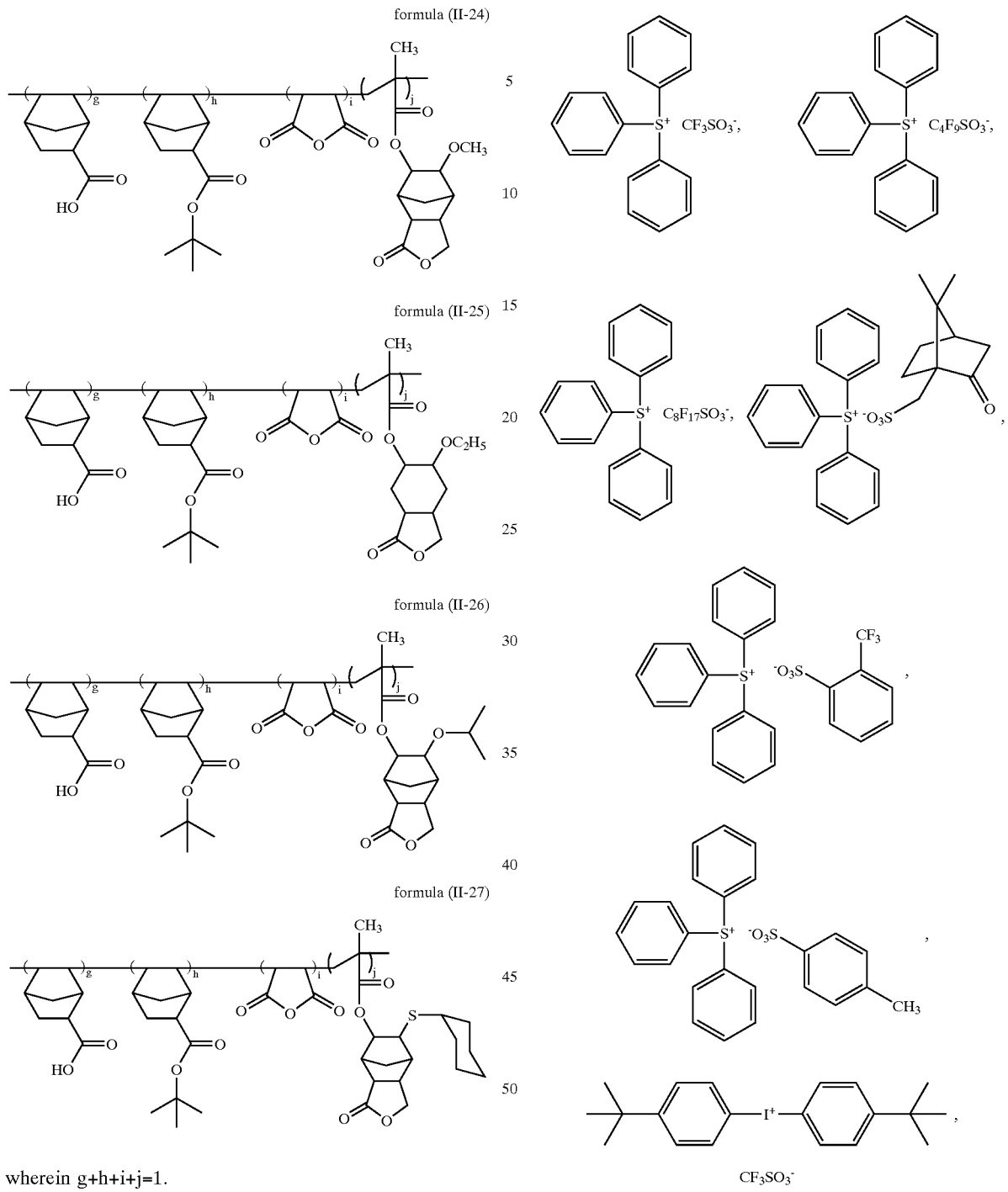

wherein g+h+i+j=1.

16. The composition of claim 7, wherein g/(g+h+i+j) ranges from 0.01 to 0.5, h/(g+h+i+j) ranges from 0.01 to 0.8, i/(g+h+i+j) ranges from 0.01 to 0.8, and j/(g+h+i+j) ranges from 0.01 to 0.8.

17. The composition of claim 1, wherein said polymer is soluble in organic solvents, and has a glass transfer temperature ranging from 50 to 220° C., a molecular weight ranging from 1,000 to 500,000, and a degradation temperature greater than 80° C.

18. The composition of claim 1, which further comprises a photo-acid generator (PAG) having one of the following formulae:

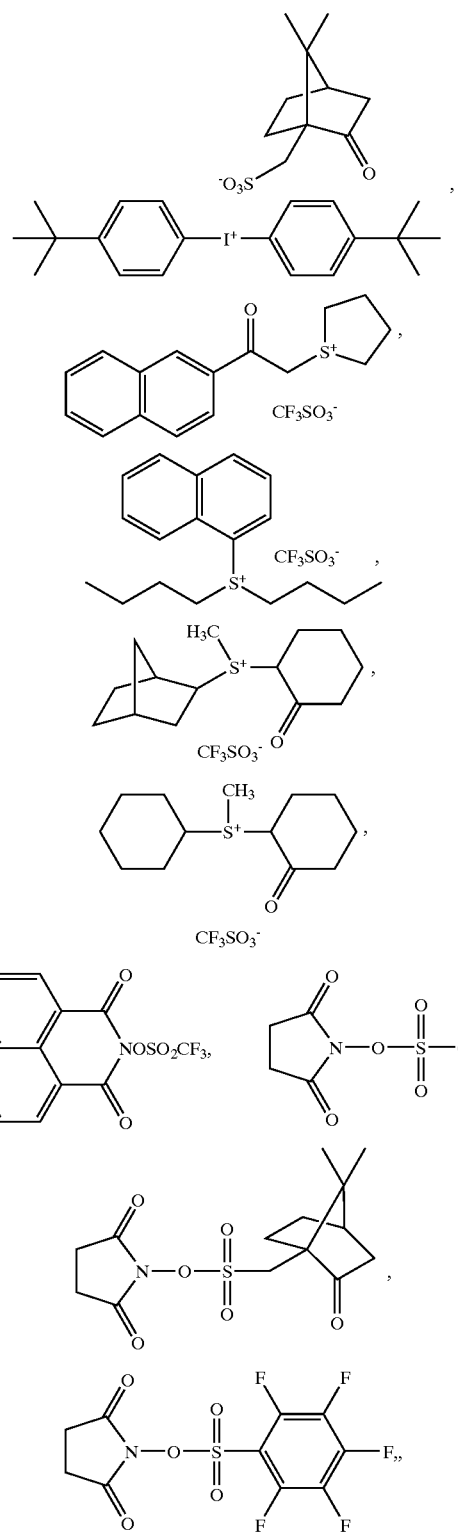

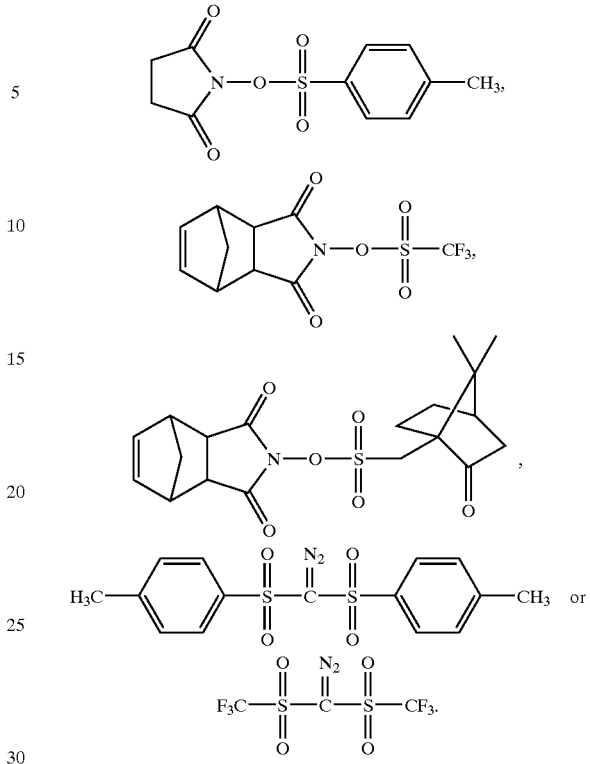

19. The composition of claim 18, wherein said photo-acid generator is added at 0.1–20 parts per 100 parts of resin in weight.

20. The composition of claim 1, which further comprises an acid quencher, said acid quencher is tetrabutylammonium hydroxide, tetrabutylammonium lactate, tributyl amine, trioctyl amine, triethanolamine, tris[2-(2-methoxyethoxy)ethyl] amine, N-(2,3-dihydroxypropyl)piperidine, N-(2-hydroxyethyl)piperidine, morpholin, N-(2-hydroxyethyl)morpholin, N-(2-hydroxyethyl)pyrrolidine, or N-(2-hydroxyethyl)piperazine.

21. The composition of claim 20, wherein said acid quencher is added at 0.001–10 parts per part of said photo-acid generator.

22. A method for the lithography of a semiconductor device wherein the composition as claimed in claim 1 is used as a chemical amplified photoresist.

23. The method of claim 22, wherein said lithography comprising an exposure step using a light source with 193 nm.

* * * * *